US007549591B2

(12) United States Patent
Lubow

(10) Patent No.: US 7,549,591 B2
(45) Date of Patent: Jun. 23, 2009

(54) COMBINED MULTI-FREQUENCY ELECTROMAGNETIC AND OPTICAL COMMUNICATION SYSTEM

(75) Inventor: Allen Lubow, Brooklyn, NY (US)

(73) Assignee: International Barcode Corporation, New York, NY (US)

( * ) Notice: Subject to any disclaimer, the term of this patent is extended or adjusted under 35 U.S.C. 154(b) by 270 days.

(21) Appl. No.: 11/395,262

(22) Filed: Apr. 3, 2006

(65) Prior Publication Data

US 2006/0186204 A1    Aug. 24, 2006

Related U.S. Application Data

(63) Continuation-in-part of application No. 10/878,963, filed on Jun. 28, 2004, now Pat. No. 7,284,704.

(51) Int. Cl.
*G06K 19/06* (2006.01)
(52) U.S. Cl. .................................. 235/491; 235/462.01
(58) Field of Classification Search ................. 235/491, 235/462.01; 343/718
See application file for complete search history.

(56) References Cited

U.S. PATENT DOCUMENTS

| | | | | |
|---|---|---|---|---|
| 5,001,458 | A | * | 3/1991 | Tyren et al. ................. 340/551 |
| 5,444,223 | A | | 8/1995 | Blama |
| 5,453,602 | A | | 9/1995 | Hanada |
| 5,481,102 | A | * | 1/1996 | Hazelrigg, Jr. .............. 235/487 |
| 5,979,758 | A | | 11/1999 | Swartz et al. |
| 6,100,804 | A | | 8/2000 | Brady et al. |
| 6,130,613 | A | | 10/2000 | Eberhardt et al. |
| 6,147,662 | A | | 11/2000 | Grabau et al. |
| 6,181,287 | B1 | | 1/2001 | Beigel |
| 6,259,369 | B1 | | 7/2001 | Monico |
| 6,280,544 | B1 | | 8/2001 | Fox et al. |
| 6,318,636 | B1 | | 11/2001 | Reynolds et al. |
| 6,354,494 | B1 | | 3/2002 | Marcus |
| 6,409,401 | B1 | | 6/2002 | Petteruti et al. |
| 6,415,978 | B1 | | 7/2002 | McAllister |

(Continued)

FOREIGN PATENT DOCUMENTS

DE          42 07 798 A1 *   9/1993

(Continued)

OTHER PUBLICATIONS

Bartronics India Limited, Barcoding Principles, 1 page, http://www.bartronicsindia.com/barcodeprinciiples.htm Printed Jan. 16, 2004.

(Continued)

*Primary Examiner*—Michael G Lee
*Assistant Examiner*—Kristy A Haupt
(74) *Attorney, Agent, or Firm*—Davidson Berquist Jackson & Gowdey LLP

(57) ABSTRACT

A communication system is provided that includes both an electromagnetic ("EM") communication device and an optical communication device including at least a machine readable symbol where at least a portion of the EM communication device and at least a portion of the machine readable symbol are formed from the same material. This material may be, for example, a conductable ink or a conductable foil. If desired, the EM communication device may include an antenna where at least a portion of the antenna includes at least a portion of the machine readable symbol.

33 Claims, 10 Drawing Sheets

U.S. PATENT DOCUMENTS

| | | | |
|---|---|---|---|
| 6,482,495 B1 | 11/2002 | Kohama et al. | |
| 6,533,168 B1 | 3/2003 | Ching | |
| 6,547,140 B2 * | 4/2003 | Marchand | 235/462.01 |
| 6,614,392 B2 | 9/2003 | Howard | |
| 6,616,047 B2 | 9/2003 | Catan | |
| 6,637,649 B2 | 10/2003 | Walsh | |
| 6,646,554 B1 | 11/2003 | Goff et al. | |
| 6,667,719 B2 | 12/2003 | Lakomski | |
| 6,714,120 B2 * | 3/2004 | Blama et al. | 235/492 |
| 6,732,923 B2 * | 5/2004 | Otto | 235/487 |
| 6,888,502 B2 | 5/2005 | Beigel et al. | |
| 6,888,509 B2 | 5/2005 | Atherton | |
| 6,922,146 B2 | 7/2005 | Yogev et al. | |
| 6,929,412 B1 | 8/2005 | Barrus et al. | |
| 6,932,272 B1 | 8/2005 | Liu et al. | |
| 6,940,467 B2 | 9/2005 | Fischer et al. | |
| 6,943,688 B2 | 9/2005 | Chung et al. | |
| 6,943,725 B2 | 9/2005 | Gila et al. | |
| 6,944,424 B2 | 9/2005 | Heinrich et al. | |
| 6,951,596 B2 | 10/2005 | Green et al. | |
| 6,952,560 B2 | 10/2005 | Feibig et al. | |
| 6,961,000 B2 | 11/2005 | Chung | |
| 6,963,317 B2 | 11/2005 | Zuk et al. | |
| 6,967,564 B2 | 11/2005 | Hulvey | |
| 6,970,088 B2 | 11/2005 | Kovach | |
| 6,970,089 B2 | 11/2005 | Carrender | |
| 6,972,394 B2 | 12/2005 | Brod et al. | |
| 6,982,646 B2 | 1/2006 | Rodgers et al. | |
| 6,984,446 B2 | 1/2006 | Gundlach et al. | |
| 6,985,119 B2 | 1/2006 | Forster et al. | |
| 6,985,122 B2 | 1/2006 | Cohen | |
| 7,221,168 B2 * | 5/2007 | Grishin et al. | 324/637 |
| 2001/0045460 A1 | 11/2001 | Reynolds et al. | |
| 2003/0070747 A1 | 4/2003 | Kydd | |
| 2004/0004131 A1 | 1/2004 | Emmert | |
| 2006/0055539 A1 | 3/2006 | Lawrence et al. | |
| 2006/0232413 A1 * | 10/2006 | Lam et al. | 340/572.1 |
| 2007/0057054 A1 * | 3/2007 | Maranov | 235/492 |

FOREIGN PATENT DOCUMENTS

| | | |
|---|---|---|
| EP | 1 065 623 A2 * | 1/2001 |
| JP | 2006-107296 A | 4/2006 |

OTHER PUBLICATIONS

Bartronics India Limited, EAS Principles, 1 page, http://www.bartronicsindia.com/easprinciples.htm Printed Jan. 16, 2004.

Bartronics India Limited, RFID Principles, 2 pages, http://www.bartronics.com/rfidprinciiples.htm Printed Jan. 16, 2004.

Bob Violino, RFID Journal, Moving from Bar Codes to RFID, 2 pages, http://www.rfidjournal.com/article/articleprint/713/-1/81 Copyright 2002.

Bruce E. Kahn, Printing Radio Frequency Indentification (RFID) Tag Antennas Using Inks Containing Metal Nanoparticles, 7 pages, Rochester Institute of Technology http://www.rit.edu/-bekpph/.

International Search Report and Written Opinion mailed Nov. 13, 2006 in corresponding International Application No. PCT/US2005/023241.

Jon Dougherty, WorldNetDaily, (Jul. 19, 2003) Technology automatically IDs Consumers 3 pages, http://www.worldnetdaily.com.

Jonathan Collins, RFID Journal, MPI Rolls Out Labels Applicator, (Oct. 2, 2003), 2 pages, http://www.rfidjournal.com/article/articleprint/600/-1/73.

Jonathan Collins, RFID Journal, Smart Labels Set to Soar, 1 page, http://www.rfidjournal.com/article/articlepring/712/-1/73, Dec. 23, 2003.

Jonathan Collins, RFID Journal, Zebra Unveils RFID Label Maker, (Sep. 25, 2003), 1 page http://www.rfidjournal.com/article/articleprint/592/-1/73.

Mark Vernon, The Symbol PDT 6800D Series, (Nov. 26, 2003), (5 pages) http://www.msnbc.com/Default.aspx.

RFID Journal, Flint Ink Revolutionizes Antennas, (Dec. 9, 2002), 1 page, http://www.rfidjournal.com/article/articleprint/41/-1/73.

RFID Journal, Label-Making Advance Touted, (Dec. 10, 2002), 1 page, http://www.rfidjournal.com/article/articleprint/129/-1/73.

RFID Journal, New Smart and Secure RFID Labels, (Mar. 26, 2003), 1 page http://www.rfidjournal.com/article/araticleprint/358/-1/73.

RFID Journal, Shock Absorbers for Smart Labels, (Nov. 20, 2003), 1 page http://www.rfidjournal.com/article/articleprint/659/-1/73.

RFID Journal, The Package is the Computer, Feb. 11, 2003(2 pages), http:/www.rfidjournal.com/article/articleprint/301/-1/73.

Steven Molesa, et al, High-Quality inkjet-printed multilevel. . . lowost RFID Applications, vol. 769 (2003), Materials Research Society Symp. Proc. (6 pages).

The Future of Paper-Making Paper More Intelligent, (Jan. 15, 2003), A Presentation to the United States Postal Rate Commission, 23 pages.

Ursula Jones, How to Get More from Your Label, Pharmaceutical and Medicasl Packaging New Magazine PMPN Article Index ((Jul. 1998), 6 pages http://www.devicelink.com/pmpn/archive/98/07/003.html.

International Search Report and Written Opinion mailed Jun. 13, 2008 in Application No. PCT/US07/07996.

* cited by examiner

COMBINED MULTI-FREQUENCY ELECTROMAGNETIC AND OPTICAL COMMUNICATION SYSTEM

CROSS-REFERENCE TO CO-PENDING APPLICATIONS

The present invention is a continuation-in-part of U.S. patent application Ser. No. 10/878,963, filed Jun. 28, 2004, entitled "Combined Electromagnetic and Optical Communication System," naming Allen Lubow as the sole inventor. The entire contents of that application is incorporated herein by reference.

FIELD OF INVENTION

The invention relates generally to a communication system capable of communicating information electromagnetically and optically, and more particularly to a multi-frequency communication system having both electromagnetic and optical communication devices where at least a portion of each communication device is formed at least partially in an overlapping manner, and in which the electromagnetic device can respond to multi-frequency signals.

DISCUSSION OF THE BACKGROUND

U.S. Pat. Nos. 5,444,223 and 6,714,120 describe radio frequency identification tags where the tags are associated with a binary number established by a pattern of ones and zeros depending on the resonance or non-resonance of plural circuits associated with the tag. However, as described in FIGS. 1 and 1A of U.S. Pat. No. 6,714,120, the tag includes an LC circuit section and a bar code section that are separate. This increases the required area for the tag.

SUMMARY OF THE INVENTION

According to an embodiment of the present invention, a communication system is provided that includes both an electromagnetic ("EM") communication device and an optical communication device where at least a portion of the EM communication device and at least a portion of the optical communication device are formed from the same material.

According to an embodiment of the invention, the optical communication device includes a machine readable symbol, such as a bar code symbol.

According to another embodiment of the invention, the EM communication device includes a radio frequency communication device, such as an RFID tag.

According to one embodiment of the invention, a conductable ink is used to form at least a portion of the radio frequency communication device and at least a portion of the bar code symbol.

According to another embodiment of the invention, at least a portion of the radio frequency communication device and at least a portion of the bar code symbol are both formed from a conductable foil through a subtractive process, such as etching.

According to another embodiment of the invention, the bar code symbol is of a format providing for equal width spaces between bars.

According to another embodiment of the invention, the optical communication device includes one or more alphanumeric symbols.

According to another embodiment of the invention, the optical communication device includes one or more logos.

According to another embodiment of the invention, the radio frequency communication device includes a memory which stores the same information encoded in the bar code symbol.

According to another embodiment of the invention, the information stored in the memory of the radio frequency communication devices and encoded in the bar code symbol identify a product.

According to one embodiment of the invention, a protective covering cover both the radio frequency communication device and the optical communication device, but the information encoded by the optical communication device can still be optically communicated through the protective covering.

According to another embodiment of the invention, the radio frequency communication device and the optical communication device are mounted on a package designed to be opened such that when the package is opened as designed, the radio frequency communication device is damaged so that it no longer communicates.

According to an embodiment of the invention, a communication system comprises an electromagnetic communication device and an optical communication device. The electromagnetic communication device includes at least an antenna. The optical communication device includes at least one machine readable symbol. At least a portion of the antenna and at least a portion of the machine readable symbol are formed from the same material. At least a portion of the antenna includes at least a portion of the machine readable symbol.

According to an embodiment of the invention, a communication system comprises a radio frequency communication device and an optical communication device. The radio frequency communication device includes at least an antenna. The optical communication device includes at least a bar code symbol. At least a portion of the antenna and at least a portion of the bar code symbol are formed from the same material. At least a portion of the antenna includes at least a portion of the bar code symbol.

In an embodiment of the invention, a method provides a communications system that includes a radio frequency communications device and an optical communications device. The radio frequency communication device includes a communications controller, a memory, and an antenna. The optical communications device includes at least a bar code symbol. According to the method, the communications controller and the memory of the radio frequency communications device are provided on a substrate. Also, the antenna of the radio frequency communications device and the optical communications device are provided on the substrate using the same material for at least a portion of the antenna and at least a portion of the bar code symbol.

According to another embodiment of the invention, a method provides a communications system that includes a radio frequency communications device and an optical communications device. The radio frequency communication device includes a communications controller, a memory, and an antenna. The optical communications device includes at least a bar code symbol. According to the method, the communications controller and the memory of the radio frequency communications device are provided on a substrate. Also, the antenna of the radio frequency communications device and the optical communications device are provided on the substrate using the same material for at least a portion of the antenna and at least a portion of the bar code symbol so that at least a portion of the antenna includes at least a portion of the bar code symbol.

According to another embodiment of the invention, a conductable ink is used to provide at least a portion of the antenna of the radio frequency communication device and at least a portion of the bar code symbol.

According to another embodiment of the invention, a conductable foil is used to provide at least a portion of the antenna of the radio frequency communication device and at least a portion of the bar code symbol.

BRIEF DESCRIPTION OF THE DRAWINGS

The following description, given with respect to the attached drawings, may be better understood with reference to the non-limiting examples of the drawings, wherein.

DISCUSSION OF THE PREFERRED EMBODIMENTS

According to an embodiment of the present invention, a combined electromagnetic-optical communication ("CEMOC") system includes both an electromagnetic ("EM") communication device and an optical communication device where at least a portion of the EM communication device and at least a portion of the optical communication device are formed from the same material. The electromagnetic communication device may be any device that communicates (e.g., sends information, receives information, or both) using electromagnetic wave energy, such as, for example, television, wireless telephone, a radio transmitter, a radio receiver, a radio transmitter, a radio transponder, or a radio frequency identification ("RFID") tag. The electromagnetic communication device may include components such as circuitry for controlling communications and a memory for storing data to be transmitted. The optical communication device may be a device that stores and communicates information optically through its physical appearance, such as, human or machine readable symbols, including, for example, alphanumeric text, brand or corporate logos, or bar codes.

Figure 1:
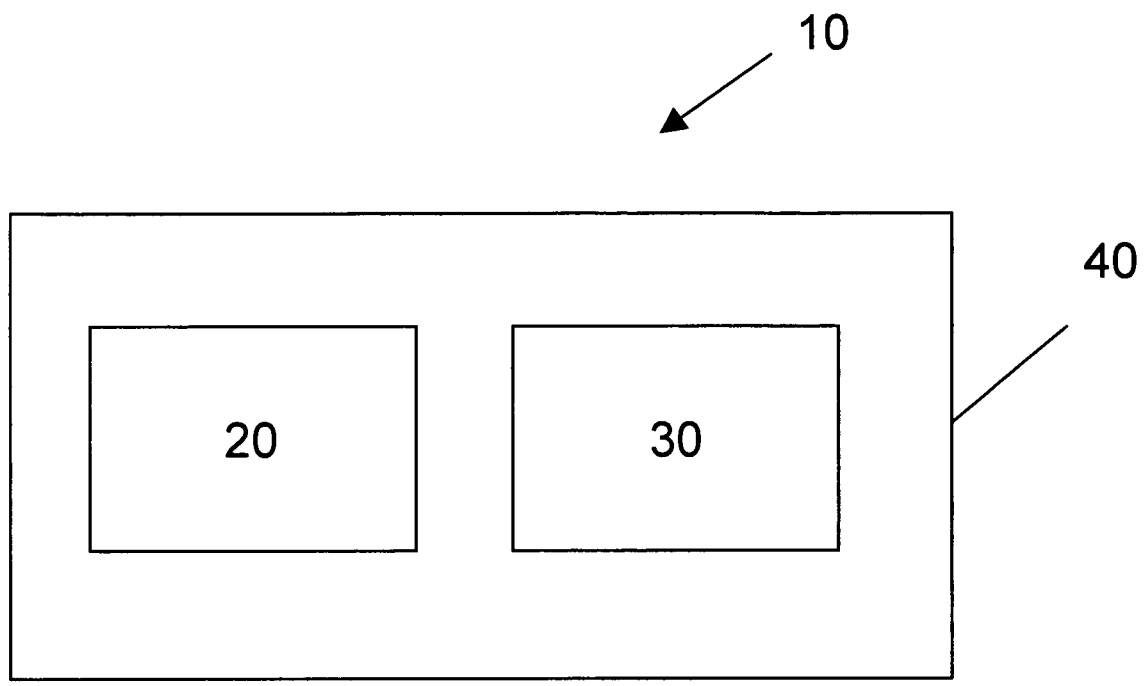
FIG. 1 is a block diagram showing the components of an embodiment of the invention.

The EM and optical communication devices of the CEMOC system may be combined in a number of ways. According to one embodiment of the invention, EM communication device 20 and optical communication device 30 of CEMOC System 10 may be combined by forming them on a single substrate 40, as shown in FIG. 1.

Figure 2:
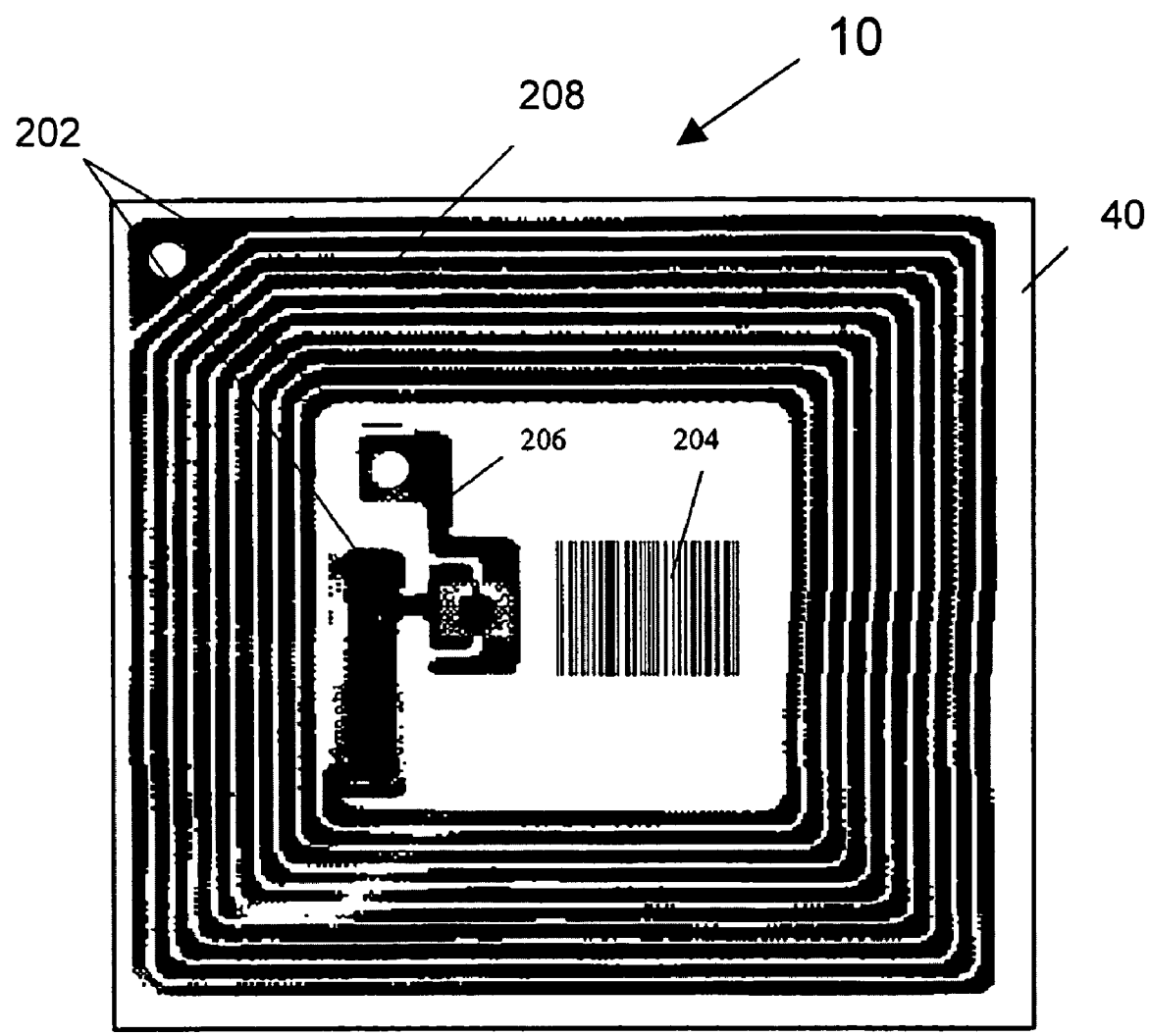
FIG. 2 is an overhead view of an embodiment of the invention.

This formation of CEMOC System 10 may be accomplished in a number of ways. According to one embodiment of the invention, at least a portion of EM communication device 20 and at least a portion of optical communication device 30 may be formed from conductable ink by printing them on substrate 40. For example, FIG. 2 is an overhead view of a CEMOC System 10 with the EM communication device comprising an RFID tag 202 and the optical communication device comprising a bar code 204. RFID tag 202 may include an antenna 208 and an integrated circuit ("IC") 206 that controls communication involving the RFID tag and includes a memory that may store data. At least a portion of RFID tag 202, such as antenna 208, and bar code 204 may both be printed on substrate 40 using a metallic or other ink capable of conducting electromagnetic energy and an inkjet printer or other known printing device capable of printing using such ink. The IC 206 may be mounted onto substrate 40 before or after antenna 208 and bar code 204 are printed. In either case, IC 206 and antenna 208 are coupled so that IC 206 may transmit and/or receive data through antenna 208.

Another way in which CEMOC System 10 may be formed is through a printing technique involving etching. According to another embodiment of the invention, at least a portion of EM communication device 20 and at least a portion of optical communication device 30 may be formed from a conductable material by removing portions of the material so that what remains of the conductable material comprises at least a portion of the EM communication device and at least a portion of the optical communication device. For example, referring again to FIG. 2, a scribing laser, which removes material as it burns, may be used to etch the antenna 208 and bar code 204 from a conductable foil. The antenna 208 and bar code 204 may then be fixed onto substrate 40, e.g., using an adhesive. Alternatively, a sheet of foil may be adhered to substrate 40 first and then antenna 208 and bar code 204 etched from the foil. Before or after antenna 208 and bar code 204 are formed, the IC 206 may be mounted onto substrate 40 so that IC 206 is coupled to the antenna in such a way as to be able to transmit and/or receive data through antenna 208.

Figure 3:
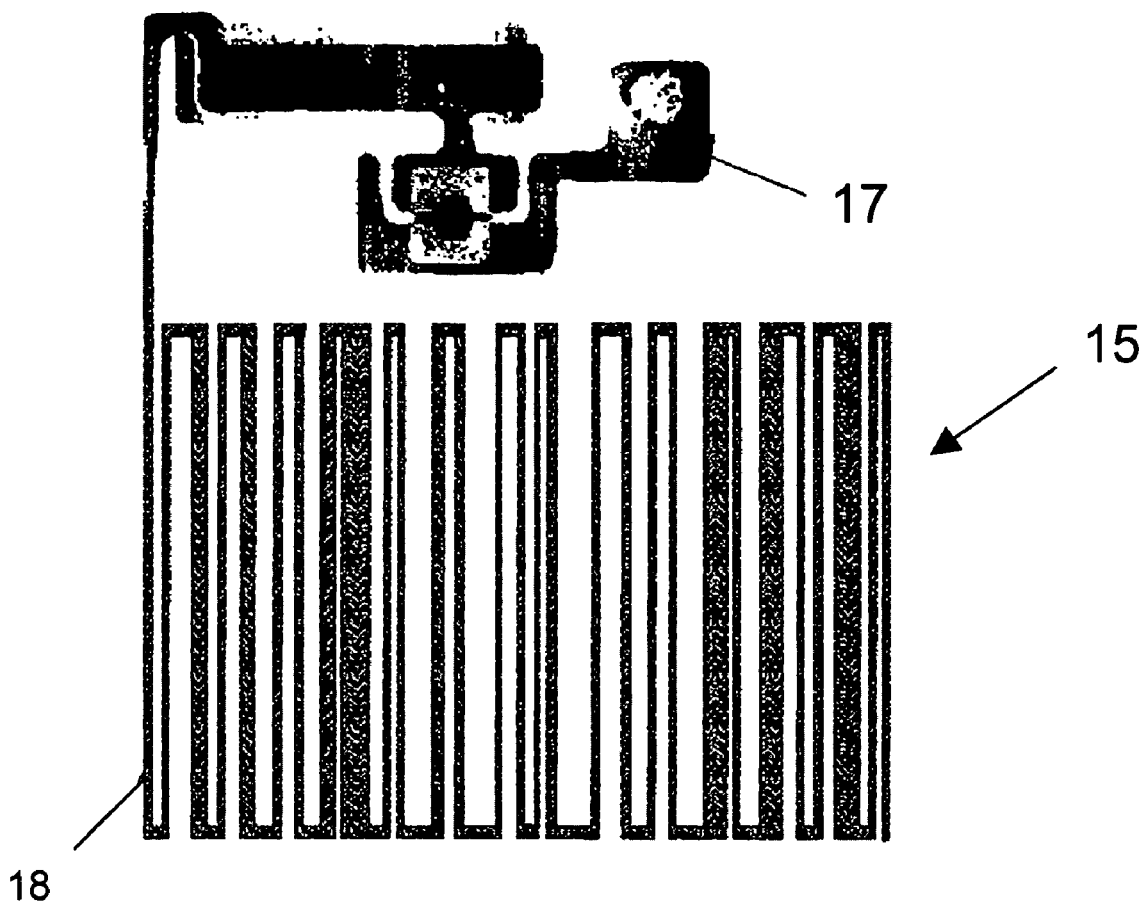
FIG. 3 is an overhead view of another embodiment of the invention.

Another way in which the EM and optical communication devices of the CEMOC system may be combined is for the optical communication device to be coupled to the EM communication device and to function as an antenna for the EM communication device. For example, FIG. 3 is an overhead view of a CEMOC System 15 where the EM communication device comprises an RFID tag including an IC 17 and an antenna 18. Antenna 18 also functions as the optical communication device of CEMOC System 15 such that the physical appearance of antenna 18 stores and provides information optically. For example, as shown in FIG. 3, antenna 18 may be shaped in the form of a linear bar code.

The CEMOC System with the combined antenna/optical communication device may be formed using similar techniques as described above in connection with FIG. 2. Thus, at least a portion of the antenna and at least a portion of optical communication device 30 may be printed using conductable ink or etched from a conductable material. Also, optical communication device 30 may be formed as a free-standing antenna, e.g., not formed on a substrate.

Where the CEMOC System includes an antenna shaped in the form of a bar code, two or more of the bars of the antenna/bar code may be connected so as to provide a continuous path coupled to the EM communication device. As is known by those in the art, this continuous path should be of a suitable length and width and be formed of such conductable material so as to enable the continuous path to serve as a suitable antenna for the communication function being performed by the EM communication device, e.g., RFID tag communication.

The bars of the bar code may be connected in any manner that does not interfere with the ability of a bar code scanner to effectively read the antenna as a bar code. For example, as shown in FIG. 3, each bar of antenna/bar code 18 may be attached to the subsequent bar of antenna/bar code 18 at alternating ends in a snaking fashion.

Figure 4:
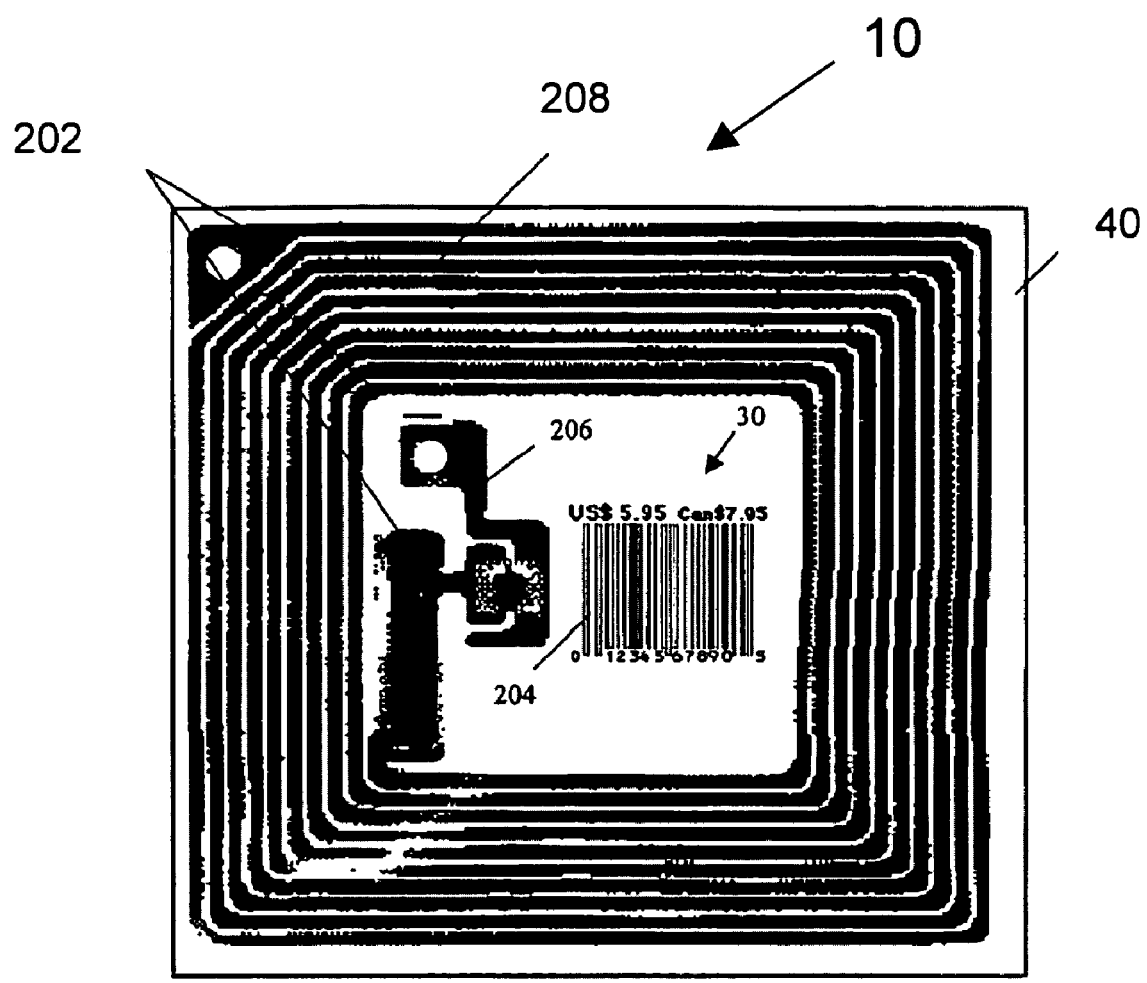
FIG. 4 is an overhead view of another embodiment of the invention, where the optical communication device comprises several parts.
Figure 5:
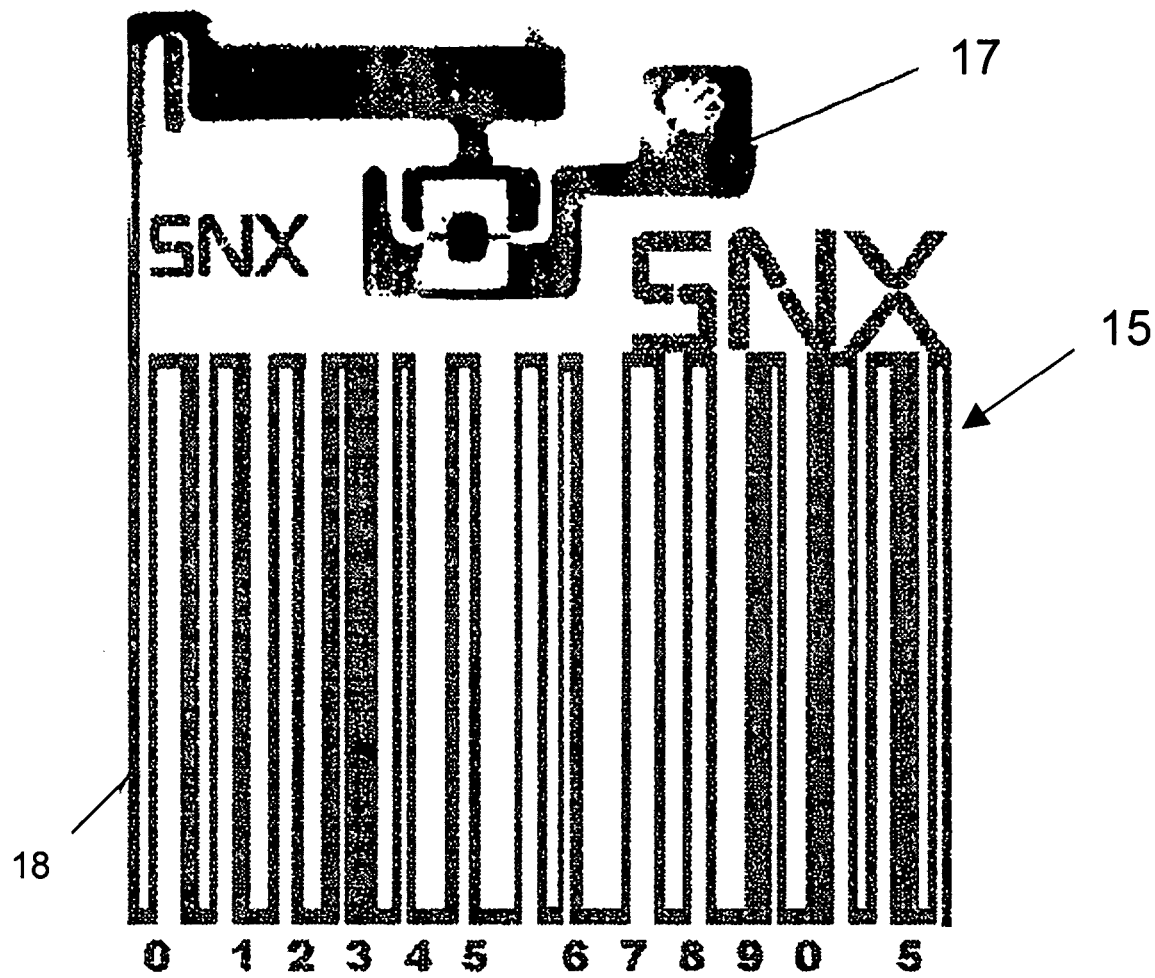
FIG. 5 is an overhead view of another embodiment of the invention, where the optical communication device comprises several parts including logos.

The optical communication device of the CEMOC system of the present invention may include one or more parts each of which may have a different appearance and store and convey different information. For example, in FIGS. 2 and 3, the optical communication devices include a single part, e.g., a bar code. In the example CEMOC System 10 of FIG. 4, optical communication device 30 includes a bar code 204 as well as human readable text. The different parts of optical communication device 30 may form a composite image, such as the EPC bar code shown in FIG. 3. However, the different parts of optical communication device 30 need not represent related information. Also, some parts of optical communication device 30 may include decorative symbols or brand or corporate logos.

Where the CEMOC System includes an optical communication device that also functions as an antenna for the EM communication device, two or more of the parts of the optical communication device may form a continuous path to serve as the antenna. For example, CEMOC System 15 shown in FIG. 5 includes an optical communication device with four parts, e.g., a linear bar code, text below the bar code, and a smaller and a larger instance of the corporate logo "SNX". As shown in FIG. 5, the linear bar code and the larger instance of the corporate logo form a continuous path to serve as the antenna for the EM communication device which, in FIG. 5, is an RFID tag.

Where the optical communication device of the CEMOC system includes several parts, the parts may all be formed at the same time or they may be formed at different times. For example, decorative symbols or logos may be printed on the substrate prior to the printing of the bar code part. In another example, human readable text may be added to the substrate after the printing of the bar code.

In the examples shown above, the optical communication device of the CEMOC system include a linear bar code. However, non-linear bar codes may be used as well. For example, an RSS bar code may be used in the embodiments shown in either FIGS. 2 or 3.

Figure 6:
FIG. 6 is an overhead view of another embodiment of the invention, where the optical communication device comprises a bar code encoded in a format of equal width spaces.

Also, different bar code formats may provide certain advantages. For example, where a subtractive technique is used to print the bar code, e.g., etching, a bar code of a format providing for equal width spaces could be created more efficiently and quickly than a bar code of a format not providing for equal width spaces. For example, the bar code shown in FIG. 5 is of the UPC (A) format which allows for four different thicknesses of background space. Thus, in a laser etching process where the laser is set to etch a predetermined width, several passes may be required to etch a space depending on the width of the space that has been coded in that bar code. In the example shown in FIG. 6, CEMOC System 15 includes optical communication device in the form of antenna/bar code 18 that is coded in the Code 25 bar code format. This bar code format uses only equal width spaces between bars. Consequently, a laser set to etch a predetermined width need only make a single pass to etch each space.

Having both optical and electromagnetic communication devices, the CEMOC system of the present invention as described above may provide information to users both visually and through electromagnetic waves. For example, where the optical communication device encodes certain information as a bar code, a user may retrieve the encoded information using known bar code scanners that use conventional line-of-sight scanning techniques, such as laser, CCD, and wand type scanners. Where the electromagnetic communication device is an RFID tag, a standard RFID reader may be used to read the information stored in the RFID tag's memory.

Where the CEMOC system of the present invention described above is combined on or mounted on a substrate, any type of substrate capable of supporting both the EM communication device and the optical communication device of the CEMOC system may be used. For example, the substrate may comprise a product tag or label. In addition, the substrate may comprise the packaging for a product.

Any substrate used should not interfere with the functionality of the EM and optical communication devices of the CEMOC system. For example, where the optical communication device includes a bar code, the surface of the substrate should be able to serve as a background for the bar code.

Thus, using the printing techniques described above, at least a portion of the EM communication device and at least a portion of the optical communication device of the CEMOC system of the present invention may be formed by, for example, printing them directly on a product tag, label or packaging using conductable ink. Alternatively, at least a portion of the EM communication device and at least a portion of the optical communication device of the CEMOC system of the present invention may be formed by, for example, affixing a conductable material, e.g., a copper foil, directly on a product tag, label or packaging, and removing, e.g., by etching, unnecessary material so that the material that remains forms the portions of the EM and optical communication devices.

Where the CEMOC system is used in environments exposing it to physical or environmental stress, it may be desirable to protect it from such stress. According to an embodiment of the invention, a protective layer is applied over the CEMOC system that does not interfere with the a user's communication with either communication device of the CEMOC system. For example, where the CEMOC system is combined on or mounted on a substrate, the protective layer may be placed over the CEMOC system and affixed to the CEMOC system and/or the substrate. So as not to interfere with the communication involving the optical communication device, the protective layer may be clear. Alternatively, the protective layer may be mostly opaque with a clear portion covering the optical communication device.

Thus, for example, the CEMOC system could be combined or mounted on a product package meant for retail, e.g., a box of breakfast cereal, and placed on the outside and bottom of the package at the location where a bar code identifying the product would conventionally be found. The protective layer would protect the integrity of the CEMOC system while allowing the optical communication device to be read, for example, in order to identify the product at a checkout counter.

If desired, the CEMOC system of the present invention may be combined or mounted on a substrate in such a way as to be rendered ineffective during the course of normal intended use. For example, where the CEMOC system is used as a product package identifier, after the product is sold, the identifier is no longer needed and, in such cases, it may be desirable for the CEMOC system to no longer function after the sale. Where the CEMOC system includes an RFID tag, this may be accomplished by combining or mounting the CEMOC system on the product packaging over an area at which the package is to be opened. For example, the CEMOC system could combined or mounted directly over the tear-open mouth of a package so that when the package is opened, the integrity of the RFID tag is destroyed so that RFID tag can no longer transmit its stored information.

Although the EM and optical communication devices of the CEMOC system of the present invention may store the same information, in certain circumstances it may be desirable for them to store different information. For example, since the optical communication device stores and conveys information through its physical appearance, e.g., as with a bar code, it may be possible for information encoded in the optical communication device to be fixed. However, since the EM communication device stores its information in a memory, the EM communication device's information may be changeable. As such, it may be desirable for the information stored in the EM communication device's memory to supplement the information stored in the optical communication device. For example, where the CEMOC system includes an RFID tag and a bar code, the bar code may encode a product ID and the memory of the RFID tag may store shipping instructions for the product.

The CEMOC system of the present invention described above provides many advantages. Where it is desirable to have the functionality of both an electromagnetic communication device, e.g., RFID tag, and an optical communication device, e.g., bar code, both of these may be printed during the same operation according to the techniques described above. Creating both an electromagnetic communication device, e.g., RFID tag, and an optical communication device, e.g., bar code, in the same operation easily allows for both devices to be encoded with the same information at one time.

The CEMOC system of the present invention may also be advantageous for technology migration. For example, where the CEMOC system is a product package identifier and includes an RFID tag and a bar code, the same information could be encoded in both the RFID tag and bar code, thereby allowing users to extract the information using established bar code systems or newer RFID reading systems. This would allow for easy transition for a user migrating from a bar code to an RFID system.

Figure 7:
FIG. 7 is an overhead view of a first chip-less embodiment of the invention that responds to multiple frequencies.

As shown in FIG. 7, it is also possible to utilize a chip-less configuration (i.e., a configuration without an IC 206) by instead integrating into the bar code a series of resonant materials or structures that resonate at a plurality of frequencies. For example, a first bar $700_1$ may resonate in the presence of a first frequency $f_1$ while a second bar $700_2$ may resonate in the presence of a second frequency $f_2$. In the exemplary embodiment shown in FIG. 7, each of the bars of the bar code ($700_1$, $700_2$, $700_3$, . . . $700_n$) resonates in the presence of a different input frequency. In this way, a value (e.g., (1) at least a portion of the value that is optically encoded by the bar code, (2) a serial number for the product having the product code optically encoded in the bar code, or (3) a manufacturing or printing date of the bar code) can also be electromagnetically encoded into the bar code by assigning different values to the frequency responses of the bars of the bar codes. For example, if the bar code was to electromagnetically encode the number 15, then the frequency response could be configured such that the bars of the bar code respond to four possible frequencies, $f_1$, $f_2$, $f_3$ and $f_4$, representing the summation of the bits $2^0$, $2^1$, $2^2$, and $2^3$. In the illustrated embodiment, if there are more bars than frequencies to respond to, then some bars may be selected to resonate at the same frequency.

Figure 8:
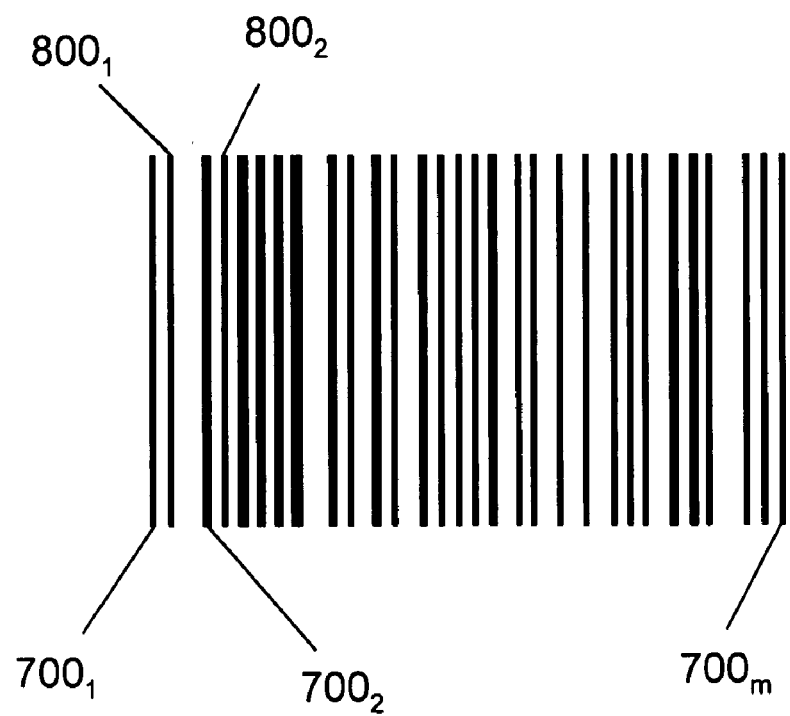
FIG. 8 is an overhead view of a second chip-less embodiment of the invention that responds to multiple frequencies.

Alternatively, as shown in FIG. 8, in another embodiment, some of the bars (e.g., $700_1$, $700_2$ . . . $700_m$) may be constructed so as to have a resonant response while other bars (e.g., $800_1$, $800_2$ . . . ) may be constructed so at to not have a resonant response. In such a case, when a frequency is not needed (e.g., because the bit that it corresponds to is a "zero"), then that bar can just be printed with a non-resonant material while the other bars ($700_1$, $700_2$ . . . $700_m$) that need a frequency response are printed with a resonant material.

Figure 9:
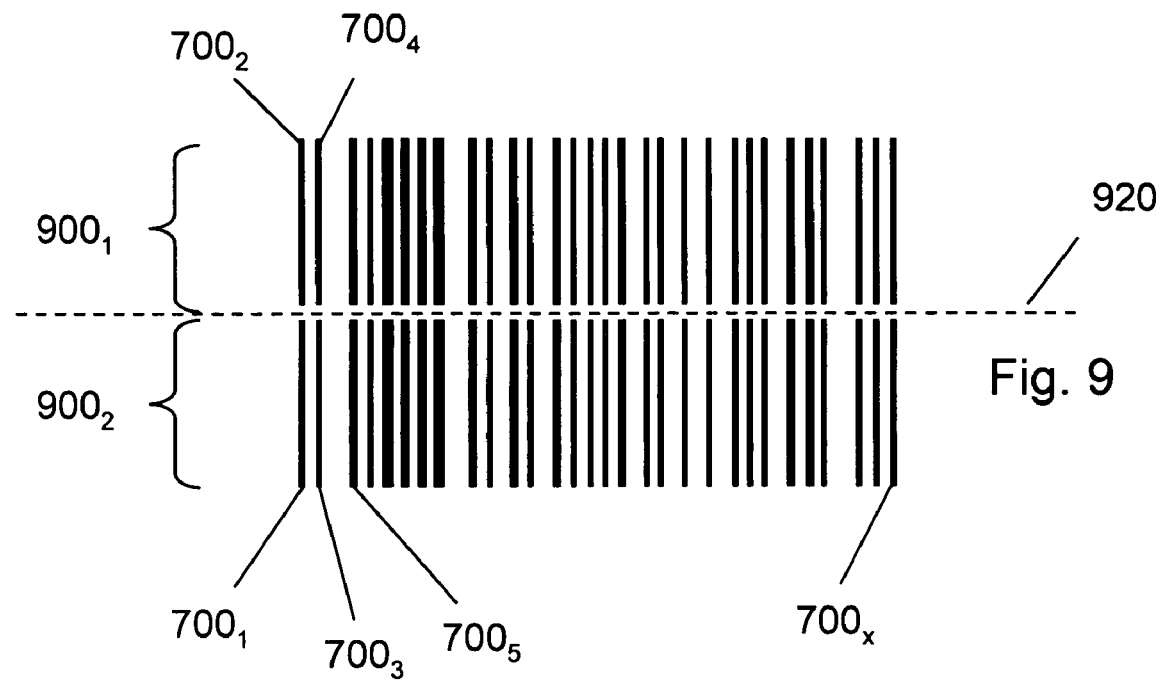
FIG. 9 is an overhead view of a third chip-less embodiment of the invention that responds to multiple frequencies.

The information that is to be encoded by the electromagnetic portion of a bar code may also be too long to be encoded by the number of bars that would normally be used to optically represent the desired information. In such a case, as shown in FIG. 9, it is possible to split the bar code into at least two sections (e.g., $900_1$ and $900_2$) along at least one line of symmetry 920. The bar code can then electromagnetically respond to up to "nx" different frequencies where n is the number of sections and x is the number of bars in the "normal" bar code. While this division into multiple sections may make the resulting bar code slightly bigger than the non-split bar code, the bar code is preferably the same size as the non-split bar code.

Figure 10:
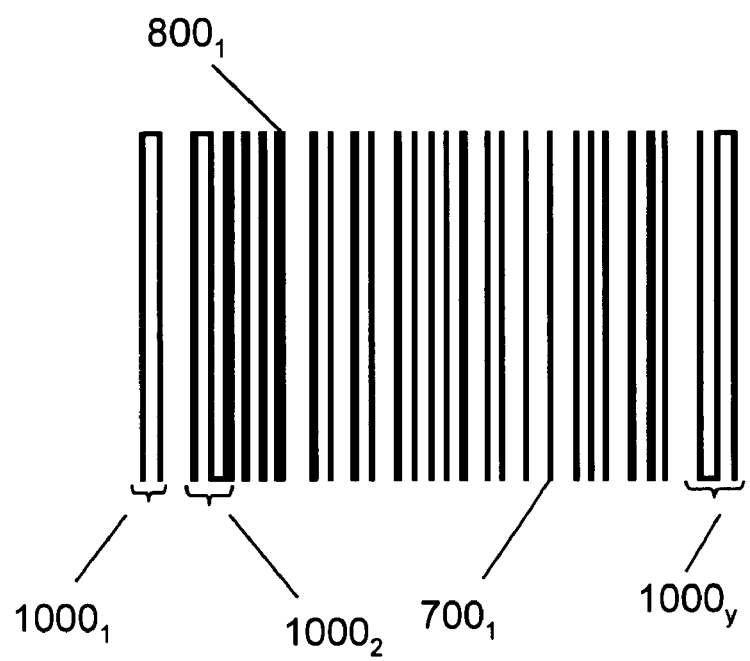
FIG. 10 is an overhead view of a fourth chip-less embodiment of the invention that responds to multiple frequencies.

As shown in FIG. 10, a combined optical and electromagnetic bar code may also include linked bars ($1000_1$, $1000_2$ . . . $1000_y$) that are plural bars tied together at one or more ends. Such a configuration may be beneficial in enabling the bars to respond to a desired frequency. As further shown in FIG. 10, a combined optical and electromagnetic bar code may include any number of the bar types of FIGS. 7-10, including linked bars (e.g., $1000_1$), resonant bars (e.g., $700_1$) and non-resonant bars (e.g., $800_1$) configured in one or more sections.

Figure 11:
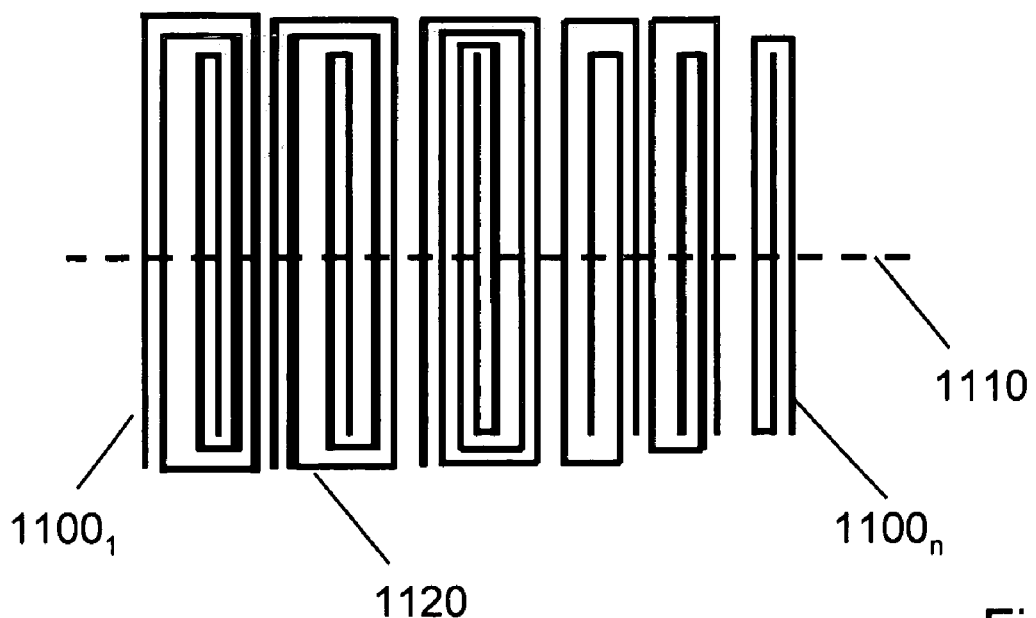
FIG. 11 is an overhead view of a fifth chip-less embodiment of the invention that responds to multiple frequencies.
Figure 12:
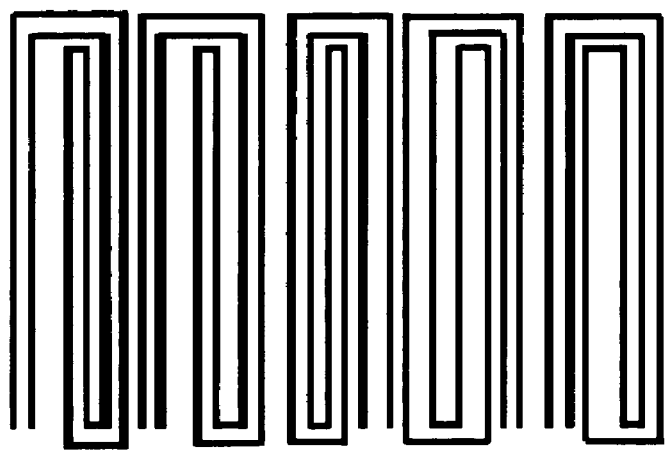
FIG. 12 is an overhead view of a sixth chip-less embodiment of the invention that responds to multiple frequencies.
Figure 13:
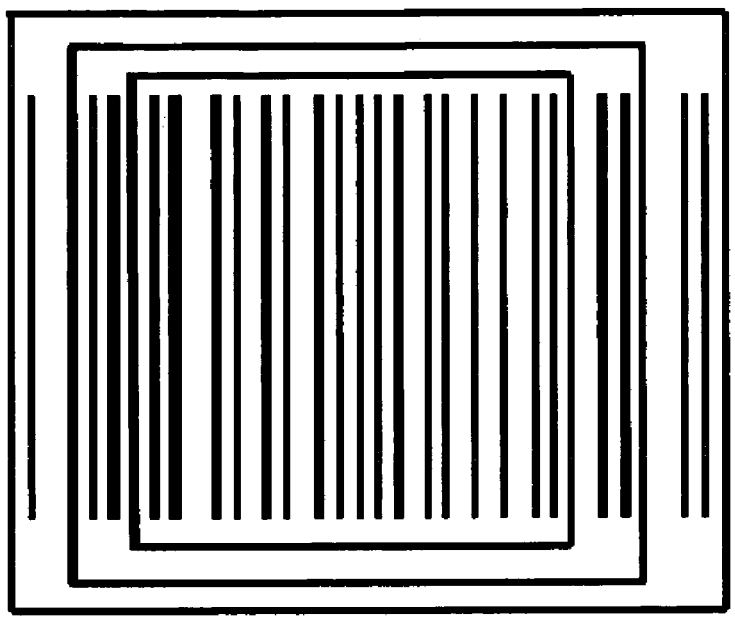
FIG. 13 is an overhead view of a seventh chip-less embodiment of the invention that responds to multiple frequencies.

Linked bars may cross sections in order to provide linked bars of various lengths. Moreover, as shown in FIG. 11, the bars of a bar code may be formed into one or more spiral configurations (e.g., $1100_1$ . . . $1100_n$) such that the spirals respond to various frequencies. The ends (e.g., 1120) of the spirals are preferably a sufficient distance from the center 1110 of the bar code so as to not interfere with the scanning process. The spirals may be either clockwise or counterclockwise spirals. As shown in FIGS. 11 and 12, the spirals may either finish at an interior of the spiral, as in FIG. 11, or at an exterior of the spiral, as in FIG. 12. As shown in FIG. 13, it is further possible to form rings of resonant material where different rings respond to different frequencies.

The resonant and/or linked bars (e.g., $700_1$ and $1000_1$) are preferably created via a printing process that utilizes a resonating material combined with an ink or a toner. The bar code may be printed in plural passes such that some bars are printed with the resonating material in one pass and others bars are printed with plain ink or toner in another pass. The two passes may even include different printing technologies (e.g., inkjet printing for one pass and laser-printing using toner for another pass). In one embodiment, the resonating materials comprise metallic fibers of various lengths where the lengths define to which frequency the resonant structure respond.

The bars may also be printed with various materials (e.g., chemicals) that can be separately detected in the presence of an alternate reader device. The individual bars of the bar code, and even different portions of the same bar, may also be printed with chemicals that respond differently to varying optical sources. For example, a certain number of bars may be printed with an ink that responds to ultraviolet light while the remaining bars do not. Based on the number and/or position of the responding bars (or bar portions) compared to the number and/or position of the non-responding bars (or bar portions), additional information may be conveyed to a corresponding reader.

It should be understood that in response to an excitation frequency (e.g., $f_1$), the corresponding structure (including any material forming the structure) embedded within the bar code that responds to that excitation frequency may resonate at the same frequency (i.e., $f_1$) or at a different frequency (e.g., $f_2$), depending on the configuration of the structure.

While not shown with any separate antennas, it should be understood that in some configurations at least one antenna may be included within or near the bar code to improve coupling of electromagnetic radiation to the bar code.

Using a multi-frequency bar code, at least a portion of the information in the bar code may be repeated or otherwise verified using the information in the resonant structures which make up at least a portion of a bar of the bar code. This cross-comparison can enable one or more readers to verify that the information optically stored in the bar code has not been altered by reading the information electromagnetically stored in the bar code, and vice versa. In the case that the information does not agree, the one or more readers can alert the appropriate party that there is a disagreement. Since this redundant information can be applied without the need for a controller chip, no malicious software (e.g., a virus) can infiltrate the information system (i.e., bar code with multi-frequency RF overlay) as could occur in configurations using controller chips.

While certain configurations of structures have been illustrated for the purposes of presenting the basic structures of the present invention, one of ordinary skill in the art will appreciate that other variations are possible which would still fall within the scope of the appended claims.

The invention claimed is:

1. An electromagnetically readable bar code, comprising:
    a series of bars and spaces forming a bar code such that the bar code is optically readable by a bar code reader to determine information optically encoded by the bar code; and
    a first resonant structure embedded within at least one bar of the bar code such that the first resonant structure resonates in response to a first frequency; and
    a second resonant structure embedded within at least one bar of the bar code such that the second resonant structure resonates in response to a second frequency which is different than said first frequency, wherein the bar code is split into at least first and second sections along a line of symmetry, and wherein the first resonant structure is embedded within at least one bar of the bar code in the first section and wherein the second resonant structure is embedded within at least one bar of the bar code in the second section.

2. The electromagnetically readable bar code as claimed in claim 1, further comprising a third resonant structure embedded within at least one bar of the bar code such that the third resonant structure resonates in response to a third frequency which is different than said first and second frequencies.

3. The electromagnetically readable bar code as claimed in claim 1, wherein at least one of the bars of the bar code is non-resonating.

4. The electromagnetically readable bar code as claimed in claim 1, wherein the first resonant structure comprises a resonating material included in an ink.

5. The electromagnetically readable bar code as claimed in claim 1, wherein the first resonant structure comprises a resonating material included in a toner.

6. The electromagnetically readable bar code as claimed in claim 1, wherein the first and second resonant structures comprise metallic fibers.

7. The electromagnetically readable bar code as claimed in claim 1, further comprising an antenna which is electrically coupled to at least one of the first and second resonant structures.

8. An electromagnetically readable bar code comprising:
    a series of bars and spaces forming a bar code such that the bar code is optically readable by a bar code reader to determine information optically encoded by the bar code; and
    a first resonant structure embedded within at least two bars of the bar code which are electrically connected to each other such that the first resonant structure resonates in response to a first frequency; and
    a second resonant structure embedded within at least one bar of the bar code such that the second resonant structure resonates in response to a second frequency which is different than said first frequency.

9. The electromagnetically readable bar code as claimed in claim 8, wherein the first resonant structure is embedded within at least three bars of the bar code which are electrically connected to each other in a spiral.

10. The electromagnetically readable bar code as claimed in claim 9, wherein the spiral starts at an exterior and ends in an interior of the spiral.

11. The electromagnetically readable bar code as claimed in claim 9, wherein the spiral starts at an exterior and ends in the exterior of the spiral.

12. The electromagnetically readable bar code as claimed in claim 8, wherein the first resonant structure is embedded within at least four bars of the bar code which are electrically connected to each other in a ring.

13. The electromagnetically readable bar code as claimed in claim 8, wherein the first resonant structure comprises a resonating material included in a toner.

14. The electromagnetically readable bar code as claimed in claim 8, wherein the first and second resonant structures comprise metallic fibers.

15. A method of forming a multi-frequency bar code, comprising:
    printing a first resonant structure to be embedded within at least one bar of the bar code such that the first resonant structure resonates in response to a first frequency; and
    printing a second resonant structure to be embedded within at least one bar of the bar code such that the second resonant structure resonates in response to a second frequency which is different than said first frequency, wherein the bar code is split into at least first and second sections along a line of symmetry, and wherein the first resonant structure is embedded within at least one bar of the bar code in the first section and wherein the second resonant structure is embedded within at least one bar of the bar code in the second section.

16. The method as claimed in claim 15, wherein the steps of printing comprise printing with toner.

17. The method as claimed in claim 15, wherein the steps of printing comprise printing with ink.

18. The method as claimed in claim 15, wherein the first and second resonant structures are printed in different bars.

19. The method as claimed in claim 15, wherein the step of printing the first resonant structure comprises printing two bars and a connector between the two bars such that the two bars and the connector resonate together.

20. The method as claimed in claim 15, wherein the steps of printing comprise printing with toner.

21. The method as claimed in claim 15, wherein the steps of printing comprise printing with ink.

22. The method as claimed in claim 15, wherein the first and second resonant structures are printed in different bars.

23. The method as claimed in claim 15, wherein the step of printing the first resonant structure comprises printing two bars and a connector between the two bars such that the two bars and the connector resonate together.

24. An electromagnetically readable bar code, comprising:
   a series of bars and spaces forming a bar code such that the bar code is optically readable by a bar code reader to determine information optically encoded by the bar code; and
   a first resonant structure embedded within at least one bar of the bar code such that the first resonant structure resonates in response to a first frequency; and
   a second resonant structure embedded within at least one bar of the bar code such that the second resonant structure resonates in response to a second frequency which is different than said first frequency, wherein the first and second resonant structures are included within the same bar.

25. The electromagnetically readable bar code as claimed in claim 24, further comprising a third resonant structure embedded within at least one bar of the bar code such that the third resonant structure resonates in response to a third frequency which is different than said first and second frequencies.

26. The electromagnetically readable bar code as claimed in claim 24, wherein at least one of the bars of the bar code is non-resonating.

27. The electromagnetically readable bar code as claimed in claim 24, wherein the first resonant structure is embedded within a subset of one bar of the bar code.

28. The electromagnetically readable bar code as claimed in claim 24, wherein the first resonant structure comprises a resonating material included in an ink.

29. The electromagnetically readable bar code as claimed in claim 24, wherein the first resonant structure comprises a resonating material included in a toner.

30. The electromagnetically readable bar code as claimed in claim 24, wherein the first and second resonant structures comprise metallic fibers.

31. The electromagnetically readable bar code as claimed in claim 24, further comprising an antenna which is electrically coupled to at least one of the first and second resonant structures.

32. The electromagnetically readable bar code as claimed in claim 24, wherein the first resonant structure comprises a resonating material included in an ink.

33. A method of forming a multi-frequency bar code, comprising:
   printing a first resonant structure to be embedded within at least one bar of the bar code such that the first resonant structure resonates in response to a first frequency; and
   printing a second resonant structure to be embedded within at least one bar of the bar code such that the second resonant structure resonates in response to a second frequency which is different than said first frequency, wherein the first and second resonant structures are included within the same bar.

* * * * *